United States Patent [19]
Kojima et al.

[11] Patent Number: 6,069,824
[45] Date of Patent: May 30, 2000

[54] SEMICONDUCTOR MEMORY DEVICE

[75] Inventors: Makoto Kojima, Osaka, Japan;
Tomoko Ogura, Wappingers Falls, N.Y.

[73] Assignees: Matsushita Electric Industrial Co., Ltd., Osaka, Japan; Halo LSI Design and Device Technologies, Inc., Wappingers Falls, N.Y.

[21] Appl. No.: 09/261,138

[22] Filed: Mar. 3, 1999

[51] Int. Cl.$^7$ ........................................ G11C 16/06
[52] U.S. Cl. ........................ 365/185.23; 365/185.25; 365/185.18
[58] Field of Search ................ 365/185.23, 185.18, 365/185.25

[56] References Cited

U.S. PATENT DOCUMENTS

| | | | |
|---|---|---|---|
| 5,406,521 | 4/1995 | Hara | 365/185.25 |
| 5,661,686 | 8/1997 | Gotou | 365/185.23 |
| 5,912,845 | 7/1999 | Chen et al. | 365/185.18 X |
| 5,936,891 | 8/1999 | Sekiguchi | 365/185.18 X |

FOREIGN PATENT DOCUMENTS 06029499  4/1994  Japan .

*Primary Examiner*—Huan Hoang
*Attorney, Agent, or Firm*—McDermott, Will & Emery

[57] ABSTRACT

A plurality of pull-down transistors, each grounding a source line at discrete positions, are provided in order that current, flowing from bit lines through some of nonvolatile memory cells having lower threshold voltages into the source line, is not concentrated at a single pull-down transistor in a source line driver during a read cycle.

8 Claims, 4 Drawing Sheets

SEMICONDUCTOR MEMORY DEVICE

BACKGROUND OF THE INVENTION

The present invention generally relates to a semiconductor memory device, and more particularly relates to an electrically erasable and programmable read-only memory (EEPROM).

A flash EEPROM, or flash memory, which includes a plurality of nonvolatile memory cells, each having a control gate, a floating gate for the storage of charges thereon, a drain and a source, and can collectively erase stored data on a predetermined block basis, is well known in the art. A flash memory is used as a built-in memory for a microcomputer, for example. In recent years, the bit width of data transmitted in a microcomputer tends to increase.

A flash memory for erasing stored data using a block of memory cells connected to a single word line as a minimum unit is described in Japanese Laid-Open Publication No. 6-29499. The flash memory includes: an erase unit block including a number N (where N is an integer) of nonvolatile memory cells; a word line connected to the respective control gates of the number N of nonvolatile memory cells; a source line connected to the respective sources of the number N of nonvolatile memory cells; and a number N of bit lines each connected to the drain of associated one of the number N of nonvolatile memory cells. In a read cycle, a positive high potential is applied by a word line driver to one terminal of the word line, a ground potential is applied by a source line driver to one terminal of the source line, and a positive low potential is applied by a read amplifier to all of the number N of bit lines. In such a configuration, nonuniformity in erasure characteristics of memory cells within a unit block can be advantageously suppressed. It should be noted that data bits stored in all of the number N of nonvolatile memory cells, of which one erase unit block is made up, are read simultaneously in this configuration.

In this prior art flash memory, current flows from the number N of bit lines through at least some of the number N of nonvolatile memory cells having lower threshold voltages into the source line and is ultimately concentrated at the source line driver during a read cycle. Assume all of the number N of nonvolatile memory cells discharge the current into the source line and the level of the current discharged by each nonvolatile memory cell into the source line is 60 $\mu$A. In such a case, if N is equal to 256, then the current flowing through the source line exceeds 15 mA.

During an erase or program cycle, potentials may be applied to a nonvolatile memory cell in any of various fashions. With regard to a so-called "NOR-type" cell, a positive high potential and a ground potential are applied to a bit line and a source line, respectively, during a program cycle. Even then, current is also concentrated at a source line driver.

In order to adopt a sub-micron rule for the purpose of implementing an array of memory cells with an even higher density, it is not preferable to allow such a large current as exceeding 15 mA to flow through a source line, which is composed of a diffused line and an aluminum line backing the diffused line and has a width of 0.5 $\mu$m, for example. In such a case, the performance of the device deteriorates because the program/read speed decreases due to a large voltage drop in the source line. In addition, a fatal problem, seriously affecting the reliability thereof, possibly happens, that is, the disconnection of the source line owing to electromigration.

SUMMARY OF THE INVENTION

An object of the present invention is preventing current from being concentrated at a source line driver of a semiconductor memory device including nonvolatile memory cells.

In order to accomplish this object, the semiconductor memory device of the present invention is provided with a plurality of switching devices for grounding a source line at a plurality of discrete positions at least during a read cycle. In particular, if source lines are arranged like a network, i.e., when a source line network is employed, the device of the present invention is provided with a plurality of switching devices for grounding the source line network at numerous discrete positions.

DETAILED DESCRIPTION OF THE INVENTION

Hereinafter, preferred embodiments of the present invention will be described with reference to the accompanying drawings.

Figure 1:
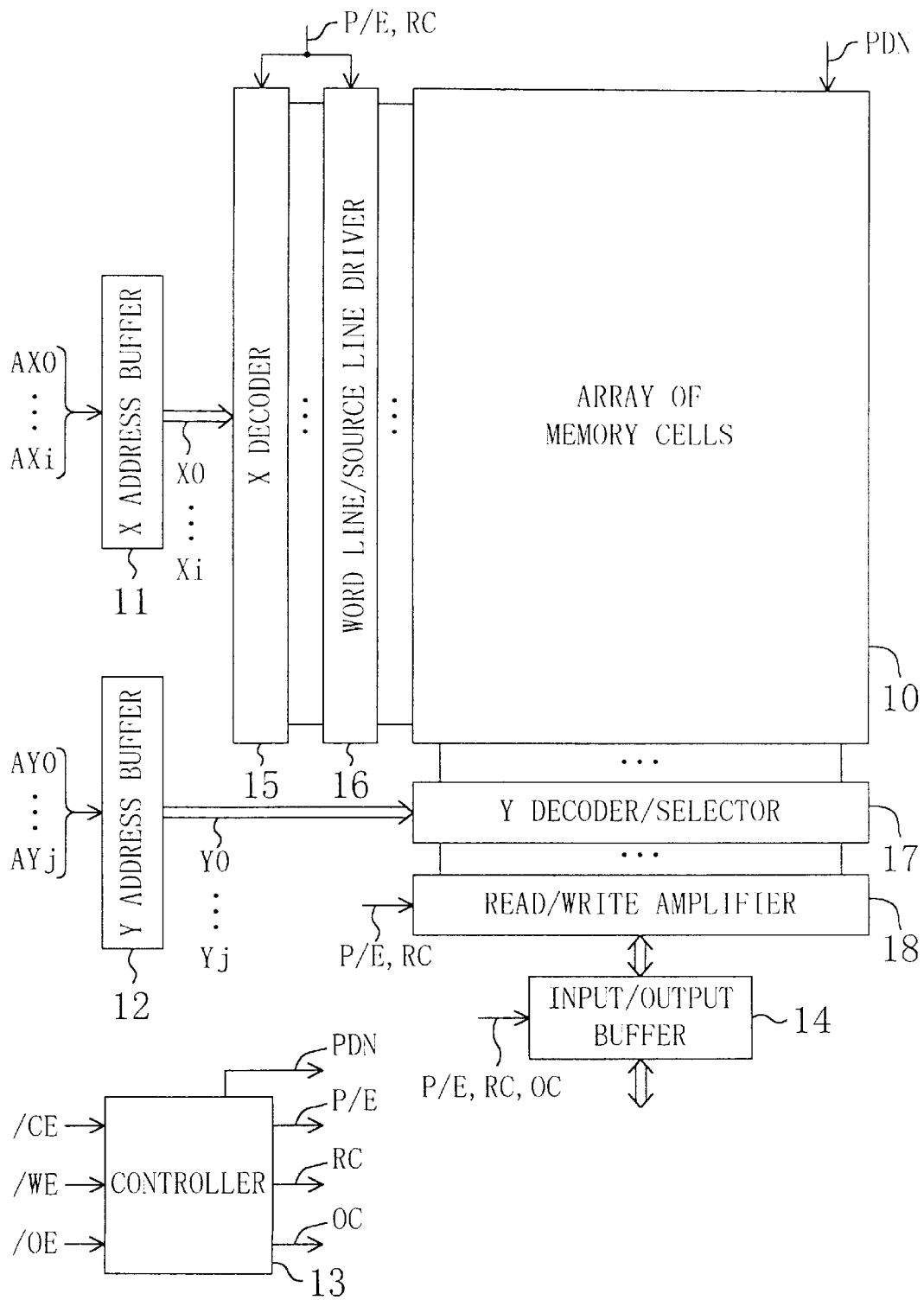
FIG. 1 is a block diagram illustrating an exemplary configuration of a semiconductor memory device according to the present invention.

FIG. 1 illustrates an exemplary configuration of a semiconductor memory device according to the present invention. The semiconductor memory device (i.e., a flash memory) shown in FIG. 1 includes: an array 10 of memory cells; an X address buffer 11; a Y address buffer 12; a controller 13; and an input/output buffer 14. In the array 10, a plurality of nonvolatile memory cells are arranged in columns and rows. The X address buffer 11 holds X address signals AX0 through AXi supplied, while the Y address buffer 12 holds Y address signals AY0 through AYj supplied. The controller 13 receives a chip enable signal /CE (where "/" indicates negative logic), a write enable signal /WE and an output enable signal /OE and generates a program/erase signal P/E, a read cycle signal RC, an output control signal OC and a pull-down signal PDN. The input/output buffer 14 holds input and output data. The program/erase signal P/E is at HIGH level during a program cycle and at LOW level during an erase cycle. The read cycle signal RC remains at HIGH level during a read cycle. The output control signal OC rises to HIGH level at a time when the flash memory should output data. And the pull-down signal PDN is asserted at HIGH level during program and read cycles. None of these signals P/E, RC, OC and PDN is dependent on any of the X and Y address signals AX0 through AXi and AY0 through AYj. The peripheral circuitry of the array 10 includes an X decoder 15, a word line/source line driver 16, a Y decoder/selector 17 and a read/write amplifier 18. The X decoder 15 receives internal address signals X0 through Xi from the X address buffer 11, while the Y decoder/selector 17 receives internal address signals Y0 through Yj from the Y address buffer 12.

Figure 2:
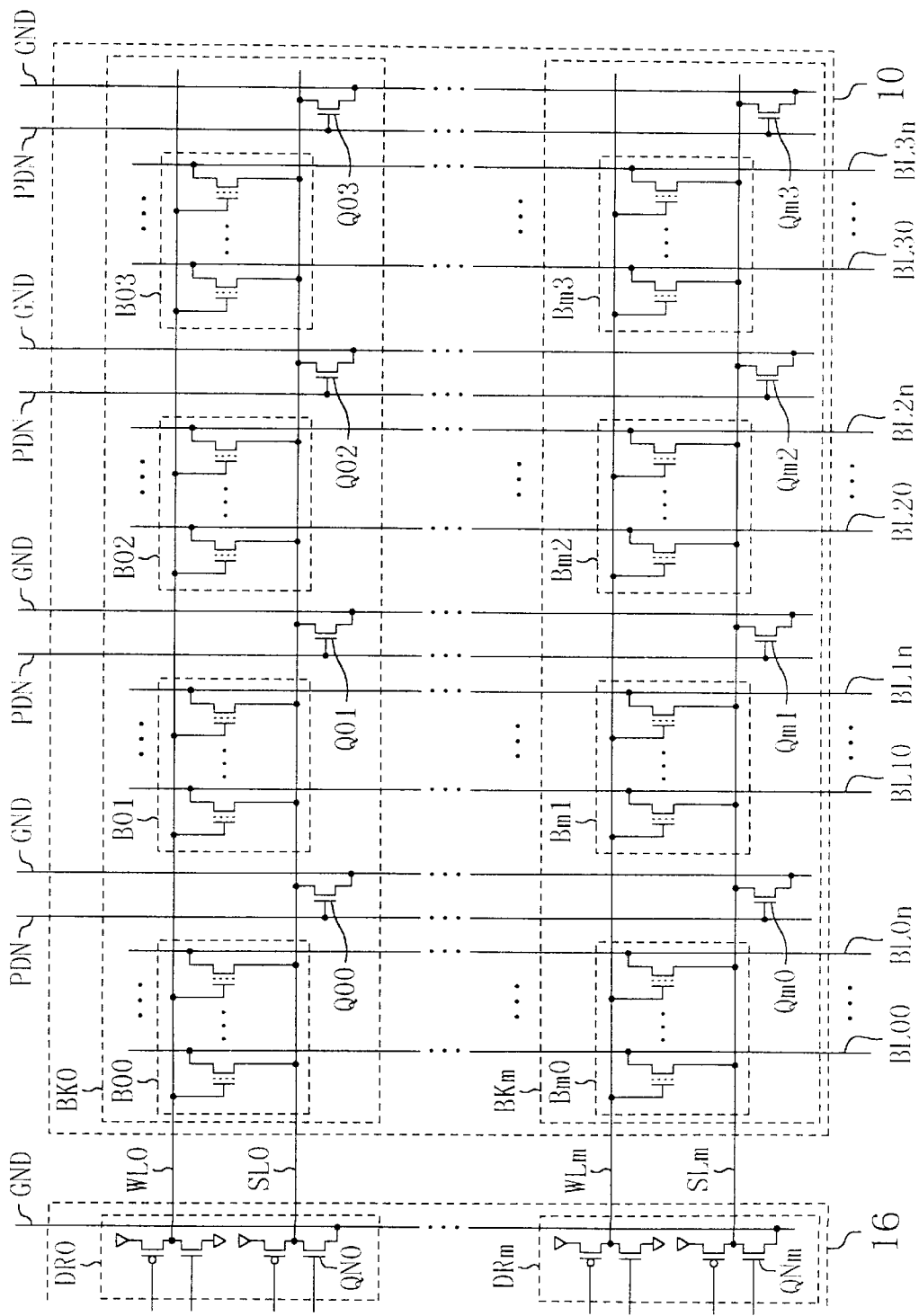
FIG. 2 is a circuit diagram illustrating an exemplary configuration of the array of memory cells shown in FIG. 1.

FIG. 2 illustrates an exemplary configuration of the array 10 of memory cells shown in FIG. 1. The array 10 shown in FIG. 2 is divided into a number m+1 (where m is an integer) of erase unit blocks BK0 through BKm and memory cells can be erased on a row basis.

An erase unit block BK0 is subdivided into four blocks B00, B01, B02 and B03 of nonvolatile memory cells, and each of the blocks B00, B01, B02 and B03 consists of a number n+1 (where n is also an integer) of nonvolatile memory cells. That is to say, the block BK0 includes a number M (=(n+1)×4) of nonvolatile memory cells, which constitute one row of the array 10 of memory cells. Each of the number M of nonvolatile memory cells includes: a control gate; a floating gate for the storage of charges thereon; a drain; and a source. In each of the number M of nonvolatile memory cells, the control gate is connected to a word line WL0 extending in the row direction, and the source is connected to a source line SL0 also extending in the row direction. Each of a number M of bit lines BL00 through BL0n, BL10 through BL1n, BL20 through BL2n and BL30 through BL3n extending in the column direction is connected to the drain of associated one of the number M of nonvolatile memory cells. The word line/source line driver 16 includes a driver unit DR0 for driving one terminal of the word line WL0 (i.e., the terminal on the left end in FIG. 2) and one terminal of the source line SL0 (i.e., the terminal on the left end in FIG. 2). A pull-down transistor QN0 included in the driver unit DR0 supplies a potential on a ground line GND to the source line SL0. The block BK0 further includes four pull-down transistors Q00, Q01, Q02 and Q03 for grounding the source line SL0 at respective discrete positions during program and read cycles. The first pull-down transistor Q00 is disposed between the blocks B00 and B01; the second pull-down transistor Q01 between B01 and B02; the third pull-down transistor Q02 between B02 and B03; and the fourth pull-down transistor Q03 on the right of the block B03. The pull-down signal PDN generated by the controller 13 is supplied to the respective gates of these pull-down transistors Q00 through Q03.

Each of the other erase unit blocks (e.g., BKm) has the same configuration as that of the block BK0. Specifically, the block BKm also includes: four blocks Bm0, Bm1, Bm2 and Bm3 of nonvolatile memory cells; a word line WLm; and a source line SLm. A driver unit DRm includes a pull-down transistor QNm. The block BKm further includes four pull-down transistors Qm0, Qm1, Qm2 and Qm3 for grounding the source line SLm at respective discrete positions during program and read cycles. Each of the number M of bit lines BL00 through BL0n, BL10 through BL1n, BL20 through BL2n and BL30 through BL3n is connected to the drains of a number m+1 of nonvolatile memory cells belonging to associated one column in the array 10.

Preferred materials for the respective lines will be exemplified. Each of the bit lines BL00 through BL0n, BL10 through BL1n, BL20 through BL2n and BL30 through BL3n is an aluminum line (first layer). Each of the word lines WL0 through WLm is composed of a polysilicon line and an aluminum line (second layer) backing the polysilicon line. Each aluminum line (second layer) is connected to an associated polysilicon line through a plurality of first contact holes. And each of the source lines SL0 through SLm is composed of a diffused line and an aluminum line (second layer) backing the diffused line. Each aluminum line (second layer) is connected to an associated diffused line through a plurality of second contact holes to form a main path for the source line current.

Hereinafter, operations of the device during erase, program and read cycles performed on the block BK0 shown in FIG. 2 will be briefly described. It should be noted that the numerical values of potentials in parentheses are nothing but illustrative examples, and are not limiting in any way.

During an erase cycle of the block BK0, the driver unit DR0 applies a negative high potential (−8 V) and a positive high potential (+5 V) to the word line WL0 and the source line SL0, respectively. The pull-down signal PDN remains at LOW level such that the pull-down transistors Q00, Q01, Q02 and Q03 are all kept OFF. Each of the number M of bit lines BL00 through BL0n, BL10 through BL1n, BL20 through BL2n and BL30 through BL3n is kept floating. In such a state, the electrons, which have been stored in the floating gate of each of the number M of nonvolatile memory cells in the block BK0, are discharged into the source line SL0. That is to say, each of cells comes to have a low threshold voltage. As a result, the data stored in each cell is erased, or reset at "0".

During a program cycle of the block BK0, the driver unit DR0 applies a positive high potential (+12 V) and a ground potential (0 V) to the word line WL0 and the source line SL0, respectively. At the same time, the read/write amplifier 18 selectively applies a positive high potential (+5 V) to some bit lines, which have been selected from a number N (where N is an integer smaller than M) of bit lines and are connected to the respective drains of cells to which data "1" should be written. The number N of bit lines have been selected by the Y decoder/selector 17 from the number M of bit lines BL00 through BL0n, BL10 through BL1n, BL20 through BL2n and BL30 through BL3n. The other bit lines are kept at the ground potential (0 V). As a result, electrons are stored in the respective floating gates of only the selected cells by the mechanism of hot electron injection. Each of the cells, having the floating gate where the electrons have been stored, comes to have a high threshold voltage. Consequently, the data stored therein is turned into "1". In this case, a pull-down signal PDN at HIGH level is supplied such that the pull-down transistors Q00, Q01, Q02 and Q03 all turn ON. Accordingly, the current, flowing from some of the number N of bit lines, which have been selected in accordance with the N-bit data to be written, through associated ones of the number N of nonvolatile memory cells into the source line SL0, is dispersed into the five pull-down transistors QN0, Q00, Q01, Q02 and Q03 and then into the ground line GND. As a result, it is possible to prevent the source line current from being concentrated at the single pull-down transistor QN0 in the word line/source line driver 16.

During a read cycle of the block BK0, the driver unit DR0 applies a positive potential (+3.3 V) and the ground potential (0 V) to the word line WL0 and the source line SL0, respectively. The read/write amplifier 18 applies a positive low potential (+1 V) to the number N of bit lines selected by the Y decoder/selector 17 from the number M of bit lines BL00 through BL0n, BL10 through BL1n, BL20 through BL2n and BL30 through BL3n. The current flowing through respective cells differs depending on whether the data stored in each of these cells is "0" or "1". Accordingly, the read/write amplifier 18 can read the logic information on each bit line by a current sensing technique. In this case, a pull-down signal PDN at HIGH level is supplied such that the pull-down transistors Q00, Q01, Q02 and Q03 all turn ON. Accordingly, the current, flowing from the number N of bit lines through some of the number N of nonvolatile memory cells having lower threshold voltages into the source line SL0, is dispersed into the five pull-down transistors QN0, Q00, Q01, Q02 and Q03 and then into the ground line GND. Thus, it is possible to prevent the source line current from being concentrated at the single pull-down transistor QN0 in the word line/source line driver 16.

In the configuration shown in FIG. 2, one erase unit block BK0 is divided into the four blocks B00, B01, B02 and B03 of nonvolatile memory cells. And the current, which is discharged from each of B00 through B03 into the source line SL0, branches right- and leftward and then flows into the ground line GND during program and read cycles. That is to say, the amount of current flowing through the source line SL0 is reduced to one-eighth compared to the conventional configuration. The same effect can also be attained in any of the other number m of source lines. Accordingly, the density of the array 10 can be tremendously increased by adopting a sub-micron rule without causing any of various problems like a decrease in program/read speed due to a large voltage drop in a source line and disconnection of each source line owing to electromigration.

Figure 3:
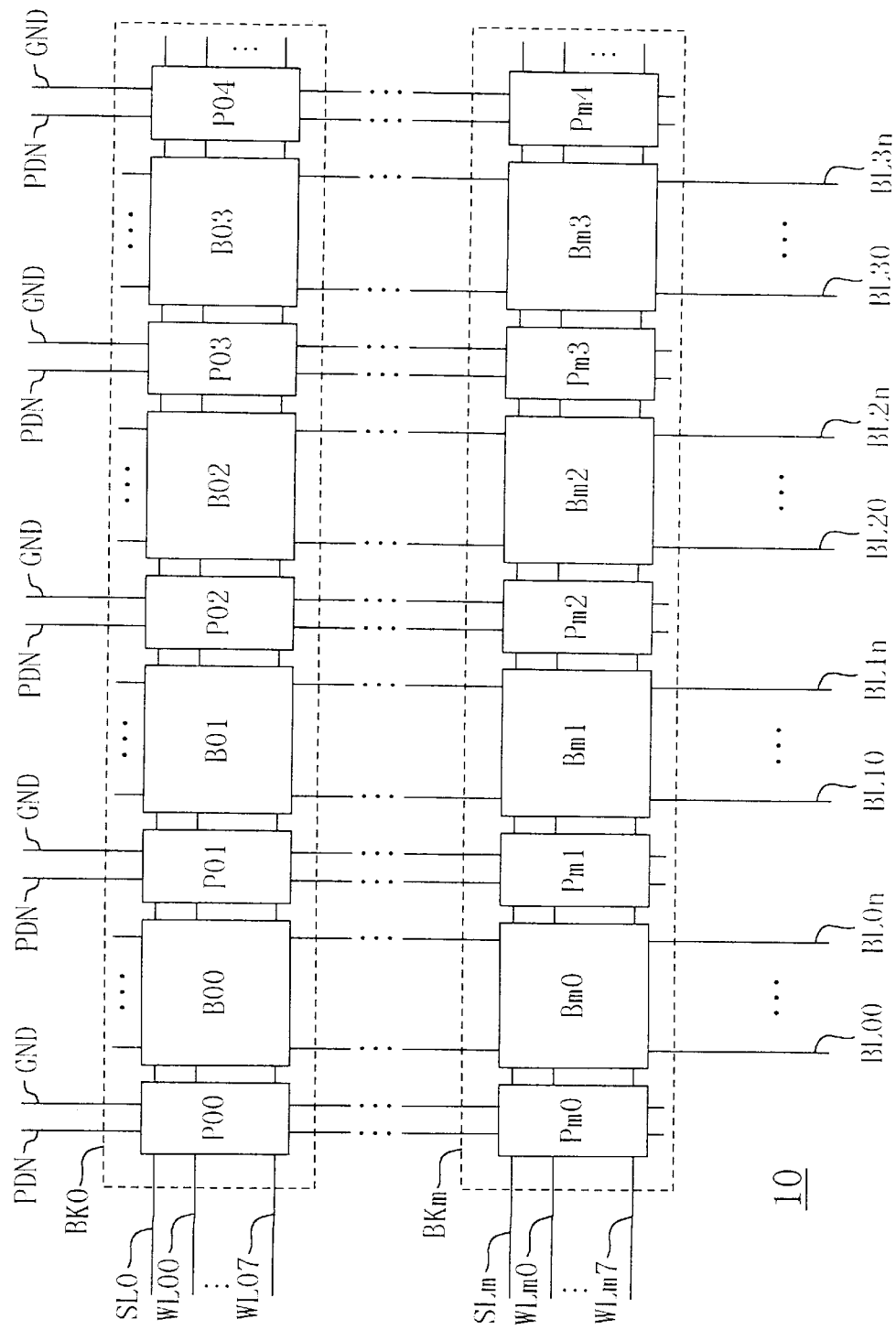
FIG. 3 is a circuit diagram illustrating another exemplary configuration of the array of memory cells shown in FIG. 1.

FIG. 3 illustrates another exemplary configuration of the array 10 of memory cells shown in FIG. 1. The array 10 shown in FIG. 3 is divided into a number m+1 (where m is an integer) of erase unit blocks BK0 through BKm and memory cells can be erased on an eight-row basis. The block BK0 includes: blocks B00, B01, B02 and B03 of nonvolatile memory cells; pull-down circuits P00, P01, P02, P03 and P04; eight word lines WL00 through WL07 extending in the row direction; and a source line SL0 also extending in the row direction. As shown in FIG. 3, the first pull-down circuit P00 is disposed on the left of B00; the second pull-down circuit P01 between B00 and B01; the third pull-down circuit P02 between B01 and B02; the fourth pull-down circuit P03 between B02 and B03; and the fifth pull-down circuit P04 on the right of B03. The word line/source line driver 16 (see FIG. 1) includes a driver unit (not shown in FIG. 3) for driving one terminal of each of the eight word lines WL00 through WL07 (i.e., the terminal on the left end in FIG. 3) and one terminal of the source line SL0 (i.e., the terminal on the left end in FIG. 3). Each of the other erase unit blocks (e.g., BKm) has the same configuration as that of the block BK0. specifically, the block BKm also includes: blocks Bm0, Bm1, Bm2 and Bm3 of nonvolatile memory cells; pull-down circuits Pm0, Pm1, Pm2, Pm3 and Pm4; eight word lines WLm0 through WLm7; and a source line SLm. Each of the number M of bit lines BL00 through BL0n, BL10 through BL1n, BL20 through BL2n and BL30 through BL3n (where n is an integer and M=(n+1)×4) extends in the column direction.

Figure 4:
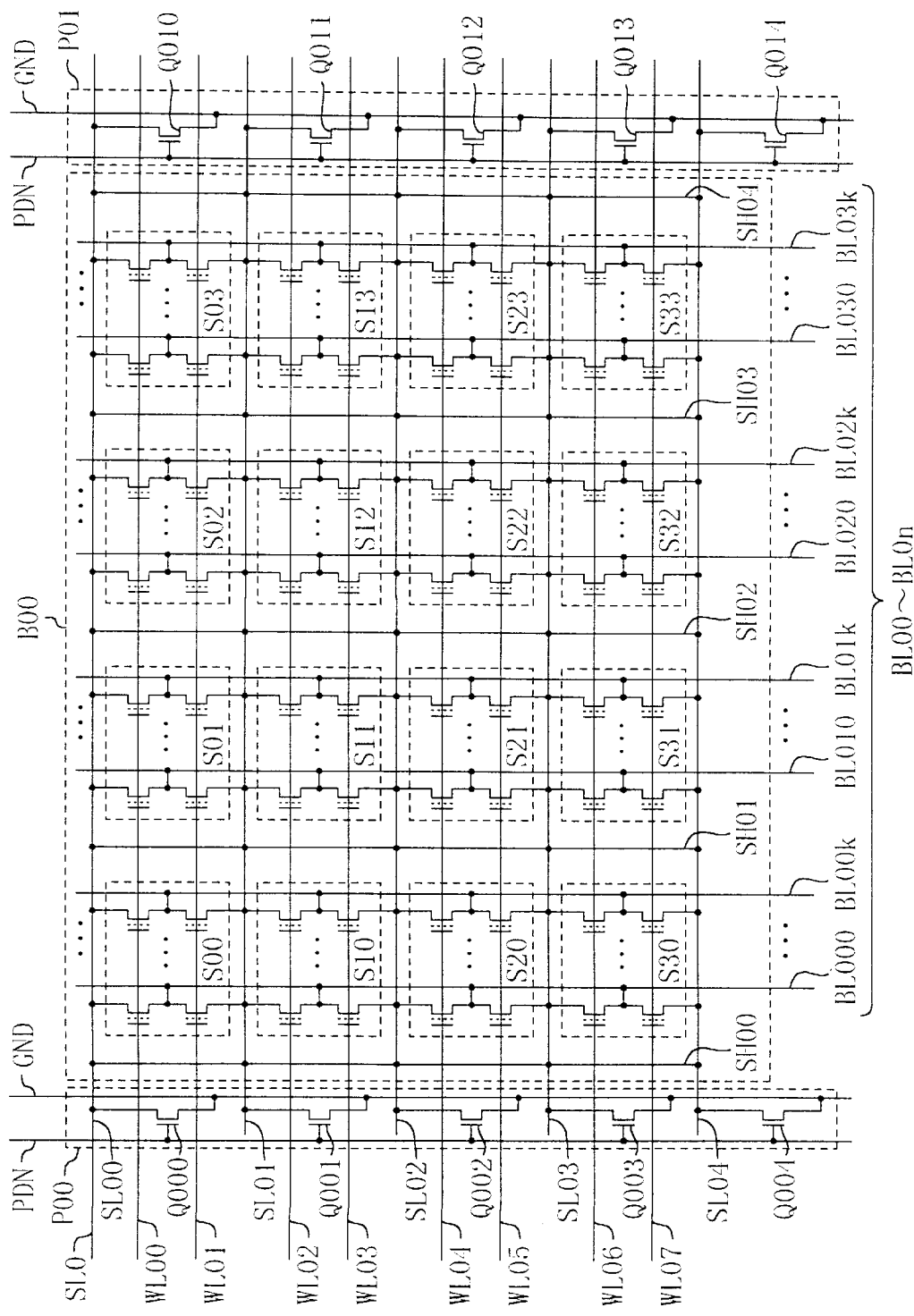
FIG. 4 is a circuit diagram illustrating a detailed configuration of part of the array shown in FIG. 3.

FIG. 4 illustrates a detailed configuration of part of the array shown in FIG. 3. A block B00 of nonvolatile memory cells is subdivided into sixteen sub-blocks S00 through S03, S10 through S13, S20 through S23 and S30 through S33, which are arranged in four columns and four rows to form a four-by-four sub-array. And each of the sub-blocks is made up of 2 (rows)×(k+1)(columns) nonvolatile memory cells (where k is an integer and (k+1)×4=n+1). That is to say, the block B00 consists of 8 (rows)×(n+1)(columns) nonvolatile memory cells. Each of the nonvolatile memory cells includes: a control gate; a floating gate for the storage of charges thereon; a drain; and a source. Each of a number n+1 of bit lines BL000 through BL00k, BL010 through BL01k, BL020 through BL02k and BL030 through BL03k is connected to the drains of associated ones of the number (n+1)×8 of nonvolatile memory cells. Accordingly, the number n+1 of bit lines BL000 through BL00k, BL010 through BL01k, BL020 through BL02k and BL030 through BL03k correspond to the bit lines BL00 through BL0n shown in FIG. 3. Each of the eight word lines WL00 through WL07 is connected to the respective control gates of the number M of nonvolatile memory cells belonging to associated one row in the block BK0.

As shown in FIG. 4, five metal shunt lines SH00, SH01, SH02, SH03 and SH04, each extending in the column direction, are provided within the block B00. Accordingly, the source line SL0 can be regarded as branching into five source branch lines SL00, SL01, SL02, SL03 and SL04, each extending in the row direction toward the other blocks B01, B02 and B03. Moreover, a set of five metal shunt lines also exists in each of these blocks B01, B02 and B03. That is to say, the five source branch lines SL00 through SL04 and the twenty metal shunt lines (including the set of five lines SH00 through SH04 shown in FIG. 4) constitute a source line structure like a network, i.e., a source line network, in the block BK0. The respective sources of the number M×8 of nonvolatile memory cells, included within the block BK0, are all connected to this source line network. More specifically, one source branch line SL00 is connected to the respective sources of the number M of nonvolatile memory cells belonging to associated one row in the block BK0. Each of three other source branch lines SL01, SL02 and SL03 is connected to the respective sources of the number M×2 of nonvolatile memory cells belonging to associated two of the remaining seven rows in the block BK0. And the other source branch line SL04 is connected to the respective sources of the number M of nonvolatile memory cells belonging to the remaining one row in the block BK0.

A first pull-down circuit P00 disposed on the left of the block B00 in FIG. 4 includes five pull-down transistors Q000, Q001, Q002, Q003 and Q004, each grounding associated one of the five source branch lines SL00, SL01, SL02, SL03 and SL04 during the program and read cycles. A second pull-down circuit P01 disposed on the right of the block B00 in FIG. 4 also includes five pull-down transistors Q010, Q011, Q012, Q013 and Q014 performing the same function. The pull-down signal PDN generated by the controller 13 is supplied to the gates of the respective pull-down transistors.

Each of the number M of bit lines BL00 through BL0n, BL10 through BL1n, BL20 through BL2n and BL30 through BL3n shown in FIG. 3 is connected to the respective drains of the number (m+1)×8 of nonvolatile memory cells belonging to associated one column in the array 10.

Preferred materials for the respective lines shown in FIG. 4 will be exemplified. Each of the bit lines BL00 through BL0n and the metal shunt lines SH00 through SH04 is an aluminum line (first layer). Each of the word lines WL00 through WL07 is composed of a polysilicon line and an aluminum line (second layer) backing the polysilicon line. Each aluminum line (second layer) is connected to an associated polysilicon line through a plurality of first contact holes. Each of the source branch lines SL00 through SL04 is composed of a diffused line and an aluminum line (second layer) backing the diffused line. Each aluminum line (second layer) is connected to an associated diffused line through a plurality of second contact holes. The aluminum line (second layer), forming a main current path in each of these source branch lines SL00 through SL04, is connected to respective aluminum lines (first layer), constituting the metal shunt lines SH00 through SH04, at respective intersections through a plurality of third contact holes. That is to say, these aluminum lines (first and second layers), arranged to form a network over the entire erase unit block, form a main path for the source line current. Two word lines extend between an adjacent pair of source branch lines. In the row direction, the second contact holes are formed at a density higher than that of the third contact holes. It is noted that the third contact holes may be formed to vertically overlap with the second contact holes.

During a program cycle of the uppermost row in the block BK0 shown in FIG. 3, the word line/source line driver 16 supplies a positive high potential (+12 V) and a ground potential (0 V) to the word line WL00 and the source line SL0, respectively. The read/write amplifier 18 selectively applies a positive high potential (+5 V) to some bit lines, which have been selected from a number N (where N is an integer smaller than M) of bit lines and connected to the respective drains of cells to which data "1" should be written. The number N of bit lines have been selected by the Y decoder/selector 17 from the number M of bit lines BL00 through BL0n, BL10 through BL1n, BL20 through BL2n and BL30 through BL3n. The other bit lines are kept at the ground potential (0 V). As a result, electrons are stored in the respective floating gates of only the selected cells by the mechanism of hot electron injection. In this case, a pull-down signal PDN at HIGH level is supplied. Accordingly, the current, flowing from some of the number N of bit lines, which have been selected in accordance with the N-bit data to be written, through associated ones of the number N of nonvolatile memory cells into the source branch line SL00, is dispersed into the other four source branch lines SL01 through SL04 via the twenty metal shunt lines and into the five pull-down circuits P00 through P04 to flow into the ground line GND. As a result, it is possible to prevent the source line current from being concentrated at the single pull-down transistor in the word line/source line driver 16.

During a read cycle of the uppermost row in the block BK0 shown in FIG. 3, the word line/source line driver 16 applies a positive potential (+3.3 V) and the ground potential (0 V) to the word line WL00 and the source line SL0, respectively. The read/write amplifier 18 applies a positive low potential (+1 V) to the number N of bit lines selected by the Y decoder/selector 17 from the number M of bit lines BL00 through BL0n, BL10 through BL1n, BL20 through BL2n and BL30 through BL3n. The current flowing through respective cells differs depending on whether the data stored in each of these cells is "0" or "1". Accordingly, the read/write amplifier 18 can read the logic information on each bit line by a current sensing technique. In this case, a pull-down signal PDN at HIGH level is supplied. Thus, the current, flowing from the number N of bit lines through some of the number N of nonvolatile memory cells having lower threshold voltages into the source branch line SL00, is dispersed into the other four source branch lines SL01 through SL04 via the twenty metal shunt lines and into the five pull-down circuits P00 through P04 to flow into the ground line GND. As a result, it is possible to prevent the source line current from being concentrated at the single pull-down transistor in the word line/source line driver 16.

In the configuration shown in FIGS. 3 and 4, one erase unit block BK0 is divided into the four blocks B00, B01, B02 and B03 of nonvolatile memory cells. And the current, which is discharged from each of these blocks B00, B01, B02 and B03 into any one of the source branch lines, is dispersed through the metal shunt lines into the other four source branch lines within the erase unit block BK0 and also branches right- and leftward to flow into the ground line GND during program and read cycles. Accordingly, the amount of current flowing through the source branch line is reduced to one-eighth or less compared to the conventional configuration. The same effect is also attained in any of the other number m of erase unit blocks. Thus, the density of the array 10 can be tremendously increased by adopting a sub-micron rule without causing any of various problems like a decrease in program/read speed due to a large voltage drop in each source branch line and disconnection of each source branch line owing to electromigration.

In the foregoing illustrative examples, one erase unit block is divided into four blocks of nonvolatile memory cells, and pull-down transistors are disposed on both sides of each block of nonvolatile memory cells. However, the erase unit block may be subdivided into an arbitrary number of blocks. The larger the number of subdivided blocks is (i.e., the larger the number of pull-down transistors provided is), the more effectively the source line current can be reduced.

If a special nonvolatile memory cell structure, different from an NOR-type cell structure, is employed, ground and positive high potentials are applied to bit and source lines, respectively, during a program cycle. However, even in such a case, positive low and ground potentials are respectively applied to bit and source lines during a read cycle. Accordingly, by providing a plurality of pull-down transistors and supplying a read cycle signal RC to the respective gates thereof as in the foregoing examples, it is also possible to prevent the source line current from being concentrated at one pull-down transistor in the word line/source line driver.

What is claimed is:

1. An electrically erasable and programmable semiconductor memory device comprising:

a plurality of nonvolatile memory cells, each said memory cell including a control gate, a floating gate for the storage of charges thereon, a drain and a source;

a word line connected to the respective control gates of the nonvolatile memory cells;

a source line connected to the respective sources of the nonvolatile memory cells;

a plurality of bit lines, each said bit line being connected to the drain of associated one of the nonvolatile memory cells;

a driver for applying a positive potential and a ground potential to the word and source lines, respectively, during a read cycle;

means for applying another positive potential to the respective bit lines during the read cycle; and a plurality of switching devices for grounding the source line at a plurality of discrete positions in order that current, flowing from the bit lines through some of the nonvolatile memory cells having lower threshold voltages into the source line, is not concentrated at the driver during the read cycle.

2. The semiconductor memory device of claim 1, further comprising means for applying a positive high potential to some of the bit lines that have been selected from the bit lines in accordance with supplied data to be written during a program cycle, wherein the driver respectively applies another positive high potential and the ground potential to the word and source lines during the program cycle, and wherein the switching devices ground the source line at a plurality of discrete positions in order that current, flowing from the bit lines, selected based on the data to be written, through associated ones of the nonvolatile memory cells into the source line, is not concentrated at the driver during the program cycle.

3. An electrically erasable and programmable semiconductor memory device comprising:

an array of nonvolatile memory cells arranged in columns and rows, each said memory cell including a control gate, a floating gate for the storage of charges thereon, a drain and a source;

a plurality of word lines, each said word line being connected to the respective control gates of the memory cells belonging to the same one of the rows that is associated with the word line in the array;

a plurality of source lines, each said source line being connected to the respective sources of the memory cells belonging to the same one of the rows that is associated with the source line in the array;

a plurality of bit lines, each said bit line being connected to the respective drains of the memory cells belonging to the same one of the columns that is associated with the bit line in the array;

a driver for respectively applying a positive potential to one of the word lines that is selected from the word lines in accordance with a given address, and a ground potential to one of the source lines that is associated with the selected word line during a read cycle;

means for applying another positive potential to the respective bit lines during the read cycle; and a plurality of switching devices for grounding each said source line at a plurality of discrete positions in order that current, flowing from the bit lines through some of the nonvolatile memory cells, which are connected to the selected word line and have lower threshold voltages, into the source line associated with the selected word line, is not concentrated at the driver during the read cycle.

4. The semiconductor memory device of claim 3, further comprising means for applying a positive high potential to some of the bit lines that have been selected from the bit lines in accordance with supplied data to be written during a program cycle, wherein the driver respectively applies another positive high potential to one of the word lines that has been selected from the word lines in accordance with the given address, and a ground potential to one of the source lines that is associated with the selected word line during the program cycle, and wherein the switching devices ground each said source line at a plurality of discrete positions in order that current, flowing from the bit lines, selected in accordance with the data to be written, through associated ones of the nonvolatile memory cells connected to the selected word line into one of the source lines that is associated with the selected word line, is not concentrated at the driver during the program cycle.

5. An electrically erasable and programmable semiconductor memory device comprising:

a block of nonvolatile memory cells arranged in columns and rows, each said memory cell including a control gate, a floating gate for the storage of charges thereon, a drain and a source;

a plurality of word lines, each said word line being connected to the respective control gates of the memory cells belonging to the same one of the rows that is associated with the word line in the block;

a network of source lines, which are arranged like a network and connected to the respective sources of all of the nonvolatile memory cells included in the block;

a plurality of bit lines, each said bit line being connected to the respective drains of the memory cells belonging to the same one of the columns that is associated with the bit line in the block;

a driver for respectively applying a positive potential to one of the word lines, which is selected from the word lines in accordance with a given address, and a ground potential to the network of source lines during a read cycle;

means for applying another positive potential to the respective bit lines during the read cycle; and a plurality of switching devices for grounding the network of source lines at a plurality of discrete positions in order that current, flowing from the bit lines through some of the nonvolatile memory cells, which are connected to the selected word line and have lower threshold voltages, into the network of source lines, is not concentrated at the driver during the read cycle.

6. The semiconductor memory device of claim 5, further comprising means for applying a positive high potential to some of the bit lines that have been selected from the bit lines in accordance with supplied data to be written during a program cycle, wherein the driver respectively applies another positive high potential to one of the word lines that has been selected from the word lines in accordance with the given address, and a ground potential to the network of source lines during the program cycle, and wherein the switching devices ground the network of source lines at a plurality of discrete positions in order that current, flowing from the bit lines, selected in accordance with the data to be written, through associated ones of the nonvolatile memory cells connected to the selected word line into the network of source lines, is not concentrated at the driver during the program cycle.

7. The semiconductor memory device of claim 5, wherein the network of source lines comprises:

a plurality of source branch lines, each said source branch line being connected to the respective sources of the nonvolatile memory cells belonging to associated one or two rows in the block; and a plurality of metal shunt lines, each said metal shunt line being provided along associated one of columns in the block and connected to the respective source branch lines.

8. The semiconductor memory device of claim 7, wherein the switching devices include a plurality of transistors for grounding associated one of the source branch lines at a plurality of discrete positions.

* * * * *